(12) United States Patent
Chan et al.

(10) Patent No.: US 6,281,551 B1
(45) Date of Patent: *Aug. 28, 2001

(54) BACK-PLANE FOR SEMICONDUCTOR DEVICE

(75) Inventors: Kevin Kok Chan, Staten Island; Christopher Peter D'Emic, Ossining; Erin Catherine Jones; Paul Michael Solomon, both of Yorktown Heights; Sandip Tiwari, Ossining, all of NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/369,928

(22) Filed: Aug. 9, 1999

Related U.S. Application Data

(62) Division of application No. 09/072,294, filed on May 4, 1998, now Pat. No. 6,057,212.

(51) Int. Cl.⁷ .................. H01L 27/01; H01L 27/12; H01L 31/0392; H01L 29/76; H01L 29/94
(52) U.S. Cl. .................. 257/347; 257/365; 257/366
(58) Field of Search .................. 257/347, 365, 257/366

(56) References Cited

U.S. PATENT DOCUMENTS

| | | |
|---|---|---|
| 4,771,016 | 9/1988 | Bajor et al. . |
| 5,188,973 * | 2/1993 | Omura et al. . |
| 5,260,137 * | 11/1993 | Rosenthal et al. ............... 428/608 |
| 5,386,342 | 1/1995 | Rostoker . |
| 5,413,952 | 5/1995 | Pages et al. . |
| 5,441,911 * | 8/1995 | Malhi ............................... 437/100 |
| 5,461,250 * | 10/1995 | Burghartz et al. ............... 257/347 |
| 5,488,243 * | 1/1996 | Tsurata et al. ................... 257/314 |
| 5,565,697 * | 10/1996 | Asakawa et al. ................ 257/347 |
| 5,619,054 * | 4/1997 | Hashimoto ....................... 257/347 |
| 5,665,631 | 9/1997 | Lee et al. . |
| 5,821,560 * | 10/1998 | Arai et al. ......................... 257/57 |
| 5,939,755 * | 8/1999 | Takeuchi et al. ................. 257/347 |

OTHER PUBLICATIONS

Sze, Semiconductor devices Physics and Technology, p. 355, copyright 1985.*

* cited by examiner

Primary Examiner—Ngân V. Ngô
(74) Attorney, Agent, or Firm—Casey P. August; McGinn & Gibb, PLLC

(57) ABSTRACT

A back-plane for a semiconductor device, includes an oxidized substrate, a metal film formed on the oxidized substrate forming a back-gate, a back-gate oxide formed on the back-gate, and a silicon layer formed on the back-gate oxide.

15 Claims, 6 Drawing Sheets

BACK-PLANE FOR SEMICONDUCTOR DEVICE

CROSS-REFERENCE TO RELATED APPLICATION

The present Application is a Divisional Application of U.S. patent application Ser. No. 09/072,294, filed on May 4, 1998, now U.S. Pat. No. 6,057,212.

The present application is related to U.S. patent application Ser. No. 09/072,294, filed on May 4, 1998, to Kumar et al., having IBM Docket No. YO998-124, assigned to the present assignee, and incorporated herein by reference.

BACKGROUND OF THE INVENTION

1. Field of the Invention

The present invention generally relates to a silicon structure and to a method of making the silicon structure, and more particularly to small complementary metal oxide semiconductor (CMOS) circuitry and a method of producing the small CMOS circuitry such as transistors, memories, etc. and integration of the same using a common substrate structure.

2. Description of the Related Art

Bonding of silicon dioxide and silicon has been practiced for many years. Several manufacturers supply wafers in which, in a desired step, two substrates are bonded together with silicon dioxide as the bonding layers.

For example, Lasky, "Wafer Bonding for Silicon-On-Insulator Technologies" *Appl. Phs. Lett.* 48 78(1986), described this procedure originally. Aspar et al., "Basic Mechanisms Involved in the Smart-Cut Process," *Microelectronic Engineering* 36 233(1997), describe the smart-cut process where a bonded wafer breaks off due to excess hydrogen. Sanchez et al., "Spontaneous Direct Bonding of Thick Silicon Nitride," *J. Micromech. Microeng.* 7 111 (1997), describe bonding with silicon nitride. Tong et al., "Silicon Carbide Wafer Bonding," *J. Electrochem. Soc*, 142 232(1995), describe bonding with silicon carbide. Goh et al., "Electrical Characterization of Dielectrically Isolated Silicon Substrates Containing Buried Metallic Layer," *IEEE Electron Device Letters* 18 232 (1997), describe use of $WSi_2$ by using a poly-silicon capping of tungsten to bond to a silicon dioxide layer.

A problem of conventional techniques and structures is that, at small gate lengths, it becomes increasingly difficult to control the flow of electrons by the gate and independent of the drain voltage. Specifically, control of current close to the gated oxide/semiconductor interface is an increasingly difficult problem as gate lengths are reduced. Achieving good control requires an electrostatic potential barrier from the channel towards the substrate.

Such a potential barrier is typically produced by doping. However, such a procedure becomes difficult at small dimensions. Specifically, this higher doping in the substrate suffers from problems of random dopant distribution and control in placing of dopants.

Another method is to provide a back-plane which is separated from the conducting silicon by a barrier of an insulator. A back-plane of thick silicon with thick oxide is described by I. C. Yang et al., "Back-gated CMOS on FOIAS for Dynamic Threshold Voltage Control", *Tech. Digest of IEDM*, 1995. However, the conventional methods of providing a back-plane for such a purpose have been problematic. For example, the insulators are thick, the backplane silicon is thick, and the method of formation leaves hydrogen in the insulator which leads to memory effects following a high temperature anneal. Further, large voltages are required.

SUMMARY OF THE INVENTION

In view of the foregoing problems of the conventional structures, it is therefore an object of the present invention to provide a method of making an inert conductive layer underneath a thin silicon layer separated by a silicon dioxide or other dielectric layer.

A second object of the invention is to provide a method for attaching an insulator layer to a metal in atomically intimate contact and with a negligible interface reaction.

Another object of the invention is to provide a conducting layer underneath the thin silicon layer that does not interfere with semiconductor manufacturing processes, is not contaminating, and can withstand processing temperatures and etching, deposition, and oxidation conditions.

Yet another object is to produce a wafer structure that will allow for newer forms of device structures to become feasible.

In a first aspect of the present invention, a method of forming a semiconductor structure, includes steps of: growing a thin oxide layer on a silicon-on-insulator (SOI) substrate to form a first wafer; separately forming a smooth metal film on an oxidized silicon substrate to form a second wafer; aligning the first and second wafers with respect to one another for attachment, thereby attaching the first wafer to the second wafer (e.g., by van der Waals' forces); performing a heat cycle for the first and second wafers, in a nitrogen ambient, to form a bond between the first and second wafers; and detaching the substrate of the first wafer from the bonded first and second wafers. Preferably, before the aligning step, at least one of a surface of the first wafer and a surface of the second wafer is hydrogentreated.

In a second aspect of the present invention, a method of forming a back-plane for a semiconductor device, includes steps of: growing an oxide layer on a first substrate to form a first wafer; separately forming a metal film on an oxidized second substrate to form a second wafer; dipping the first and second wafers in an acid mixture; aligning the first and second wafers with respect to one another for attachment; performing a heat cycle to form a bond between the first and second wafers; and detaching a portion of the first wafer from the second wafer, to form a wafer structure.

Preferably, the refractory metal includes tungsten.

In a third aspect of the present invention, a method of forming a back-plane, includes steps of: forming a first wafer including a silicon-on-insulator (SOI) structure; bonding the first wafer to a second wafer, the second wafer including a refractory metal-coated substrate; and removing the first wafer from the second wafer, thereby forming a backplane for a semiconductor device.

With the unique and unobvious features of the present invention, a method is provided for producing back-planes which allow for an electrostatic potential barrier by a back-bias, and produces substrates with such back-planes.

In an exemplary embodiment, the present invention provides bonding at an 8-inch wafer scale with a back-plane of, for example, tungsten. Tungsten is shown to maintain its interface acuity through high temperature bonding. This allows back-plane transistors and other structures to be fabricated easily, reliably, and with excellent performance characteristics.

Additionally, present microelectronics fabrication methods can continue to be used on these substrates to form devices with superior characteristics and also allows for different forms of devices.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
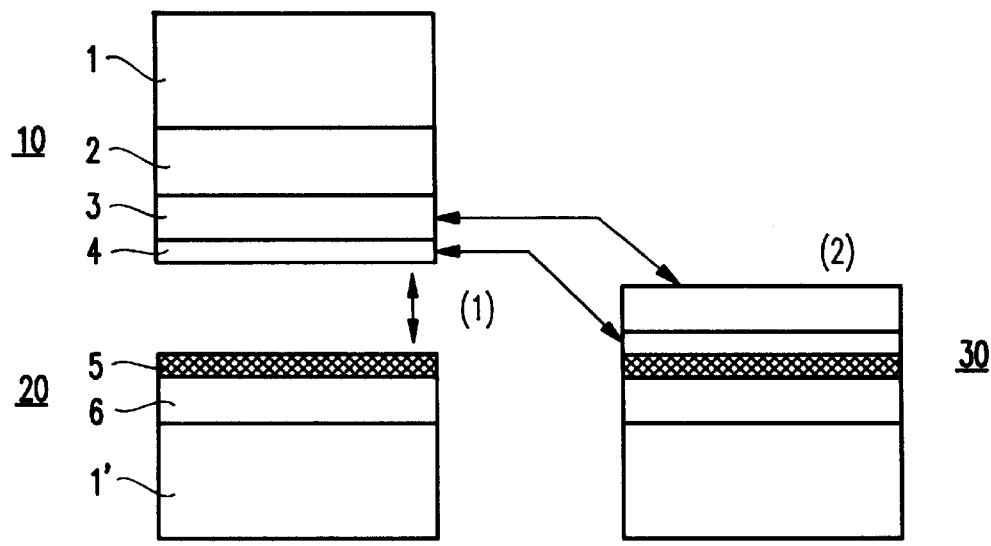
FIG. 1 illustrates a small (e.g., on the order of about a 25-nm gate length) transistor which incorporates the present invention preferred embodiment of the method steps of the present invention including formation of a metal back-plane by bonding and removal of the sacrificial wafer.

Referring now to the drawings, and more particularly to FIG. 1, there is shown a first embodiment of the present invention.

As mentioned above, generally the present invention provides a method for attaching an insulator layer to a metal in atomically intimate contact and with negligible interface reaction. The electrical and metallurgical characteristics of the formed junction and the materials allow for fabrication of semiconducting electrical devices on them.

Turning now to FIG. 1, a preferred embodiment is shown of the method according to the present invention.

In step 1, a substrate 1 (e.g., a silicon-on-insulator (SOI) substrate 1) is provided in which an oxide layer 2 is grown on the SOI substrate 1 (e.g., a first wafer 10 forming a sacrificial wafer) where the surface roughness of the silicon starting material is kept to less than 0.5 nm in rms roughness using touch-polishing or other means. Touch-polishing is a known technique and involves orientation-selective polishing.

Preferably, the silicon-on-insulator (SOI) substrate 1 has a silicon top layer thickness of substantially within a range of about 3 to 300 nm, whereas the oxide layer 2 has a thickness of substantially within a range of about 1 to 20 nm. As shown, a single crystal layer 3 is present on the oxide layer 2 and has a thickness of substantially within a range of about 3–500 nm. A silicon dioxide/back gate oxide 4 is present on layer 3.

In a lower portion of FIG. 1, a relatively smooth (e.g., less than 0.5 nm roughness) metal film 5 (e.g., preferably tungsten, WN, TiN, or the like) is formed on an oxidized silicon substrate 1' separately (e.g., to form a second wafer 20). Specifically, the metal film 5 which forms a back-plane is formed on a buried oxide layer 6 of the silicon substrate 1'.

Preferably, the refractory metal has a thickness substantially within a range of about 10 nm to 200 nm, and the silicon layer of substrate 1' has a thickness of substantially within a range of about 3 to 300 nm. The characteristics of silicon substrate 1 and 1' are substantially the same. As mentioned above, an oxide 6 exists between the back-plane 5 and the silicon substrate 1'.

Following a particle-cleaning of at least one (and preferably both wafers) wafer preferably using megasonic techniques and/or many other known cleaning methods, at least one (and preferably both) of the first and second wafers 10, 20 are dipped in, for example, 100:1 diluted hydrofluoric acid mixture, thereby to provide hydrogen termination, and are rinsed and dried in a spinner or the like. Thus, preferably at least one of a surface of the first wafer and a surface of the second wafer is hydrogen-treated.

Figure 2:
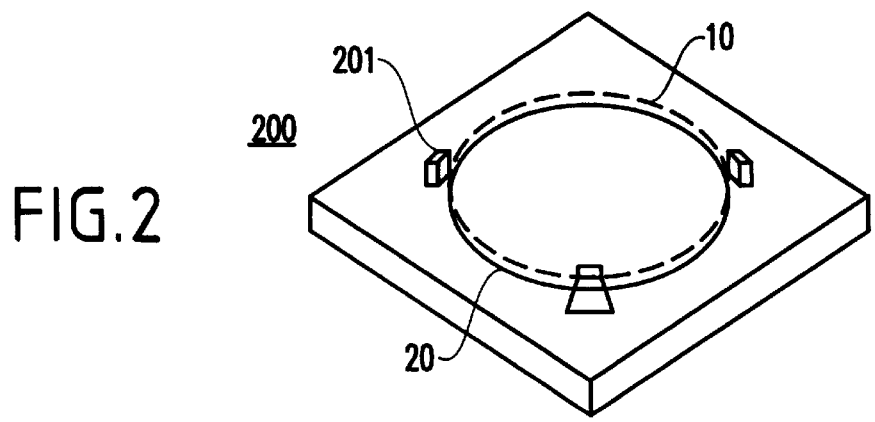
FIG. 2 is a perspective view of a bonding jig for use with the present invention.

A bonding jig 200, as shown in FIG. 2, which allows for orientation alignment, is used to initiate the attachment of the two wafers 10, 20. The bonding jig 200 includes guides 201 for aligning the wafers 10, 20 with respect to one another.

The bonding is initiated in the jig through the controlled placement of the top wafer (e.g., wafer 10, but of course any of wafers 10, 20 may constitute the "top" wafer) onto the jig 200 and then placed upon the lower wafer, thereby to attach together the upper and lower wafers by, for example, van der Waals' forces. Bonding is initiated by placement and contact initiated by placement of a roller or wedge on the assembly. As mentioned above, either of the two wafers 10, 20 can be used for this step as the top wafer. The attached wafers can now be transferred together.

Thereafter, a heat cycle, preferably in a nitrogen ambient, is performed to form a permanent bond between the two wafers 10, 20.

Specifically and for example, a thermal cycle is performed including a gas (e.g., nitrogen, argon, or the like) purge of the wafer-containing chamber so that other gas levels (e.g., other than nitrogen) are reduced to below 0.01%. flows, thereby to purge the chamber a plurality of times (e.g., 50). Again, it is noted that "sufficient" gas to purge the chamber may be when other gas levels are reduced to below 0.01%, The chamber purging is followed by introduction of the structure (e.g., the two wafers bonded together) into the furnace tube at 650° C. where nitrogen flows, stabilization of the temperature for 15 minutes to 650° C. (e.g., "stabilization" of the temperature means when the temperature increases to 650° C. again since putting the wafer into the chamber places a thermal load on the chamber, which lowers the temperature), and an anneal for approximately 30 minutes, a thirty-minute rise to 750° C., stabilization for 15 min. and an annealing for 30 min., followed by similar steps at 850° C., 950° C., and 1050° C., and up to 1100° C. for up to 2.5 hours, and then a 90 minute cool-down to 650° C. forms a strong stress-free bond. It is noted that the heating and cooling should be relatively slow to minimize stress and to provide for bond uniformity.

In step 3 of the inventive method, the sacrificial wafer (e.g., wafer 10) is substantially detached by grinding, wet etching the last few microns of silicon in hot KOH (e.g., preferably 85° C.), and removal of the oxide, for example, by buffered HF, wafer structure 30 is left including single crystal layer 3 and back gate oxide 4 of the wafer 10, as shown in FIG. 1.

In step 4, the wafer structure 30 is touch polished in order to obtain a substantially smooth surface (e.g., a surface having a surface roughness of preferably 0.5 nm or less). The completed structure 30 includes substrate 1', oxide 6, back-plane 5, back gate oxide 4 and single crystal layer 3, as shown in FIG. 1. Thus, in the remaining product, the substrate of the first wafer (e.g., sacrificial wafer) is removed from the second wafer.

Figure 3:
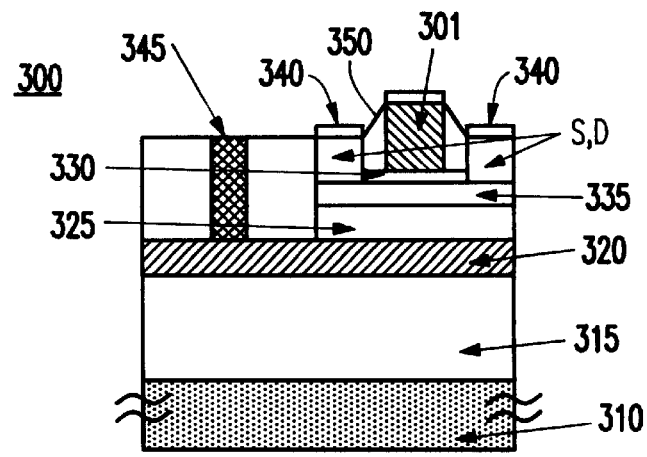
FIG. 3 is a schematic cross-section of a small transistor which incorporates the present invention and which uses a back-plane gate to control the threshold voltage and to keep the carriers at the top gate's oxide/silicon interface.

FIG. 3 illustrates a schematic cross-section of a small transistor 300 that uses a back-plane gate 301, according to the present invention, to control the threshold voltage and to keep the carriers at the top gate's oxide/silicon interface. Specifically, the silicon substrate 310, the back-plane 320 of the metal (e.g., refractory metal such as tungsten), and the silicon channel 335 are the same as that produced after the removal of the sacrificial wafer 10 discussed above. Also shown are the back insulator 315, back gate insulator 325, front gate insulator 330, silicide contacts 340, back-plane contact 345, source and drain extrinsic regions, S, D, and side-wall 350, and the front gate 301.

Figure 4:
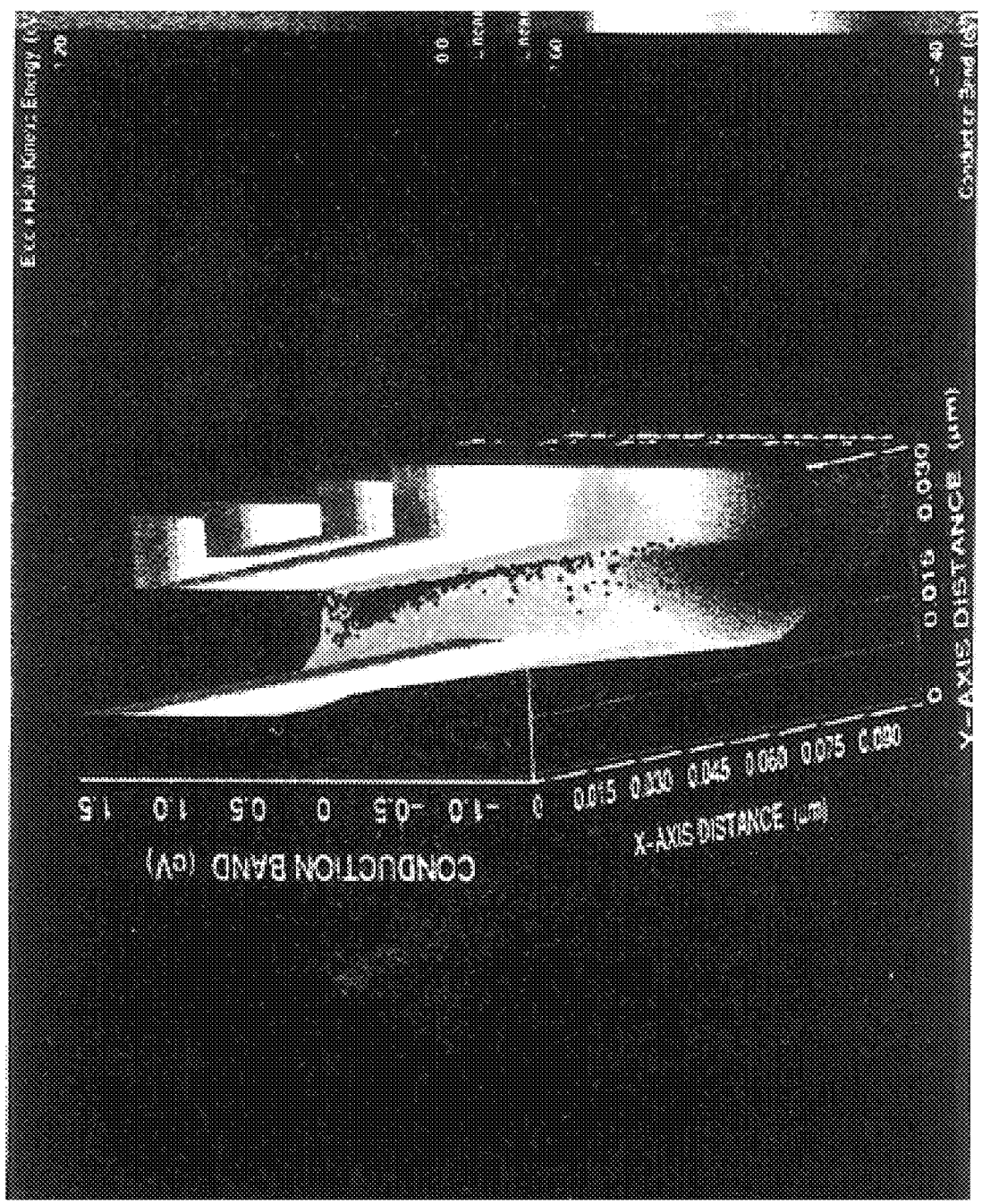
FIG. 4 shows the conduction band-edge and the carriers as a function of position and energy through the small device structure with a back-plane used to push the carriers to the top gate's oxide/silicon interface and illustrates a simulation of how the invention operates.

FIG. 4 shows operation of the inventive structure and specifically the conduction band-edge and the carriers as a function of position and energy through the small device structure with a back-plane used to push the carriers to the top gate's oxide/silicon interface. Specifically, the transport of electrons is shown under back-bias through the small transistor showing the carrier at the oxide-silicon interface. FIG. 4 also shows that the electrons can be kept at the front oxide-silicon interface during transport.

Figure 5:
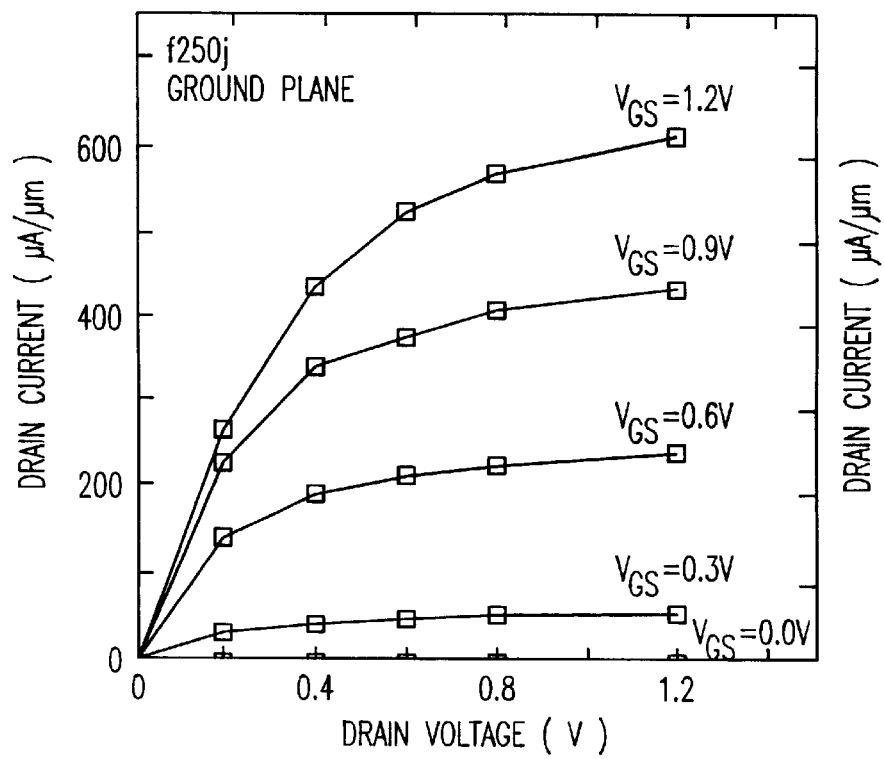
FIG. 5 illustrates a simulation of how the invention operates, and shows the resulting current-voltage characteristics having good output conductance because of the control using the back-plane of the present invention.

FIG. 5 shows the resulting current-voltage characteristics showing good output conductance because of the control using the back-plane of the present invention. Specifically, the graph clearly illustrates the output characteristics of the small transistor device using the back-plane of the present invention to control the threshold voltages and sub-threshold characteristics. These devices, at a 25-mn gate length, would have output conductance degraded by more than a factor of 2 in the absence of the backplane and will have variability from device to device due to random dopant effects.

Figure 6:
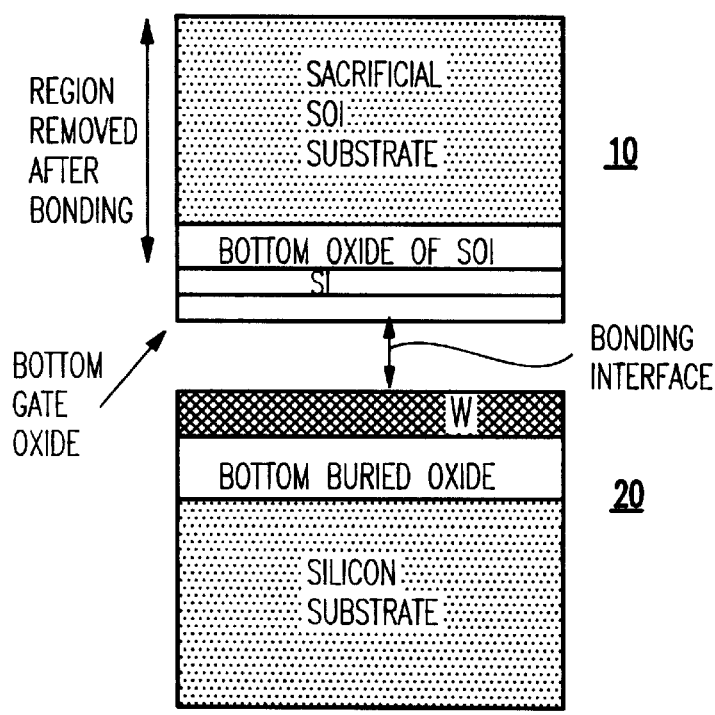
FIG. 6 shows a step of bonding a refractory metal (e.g., tungsten) to the oxide interface.

FIG. 6 shows the step of bonding a refractory metal (e.g., tungsten) to the oxide interface, as described above in connection with FIG. 1, in greater detail.

Figure 7:
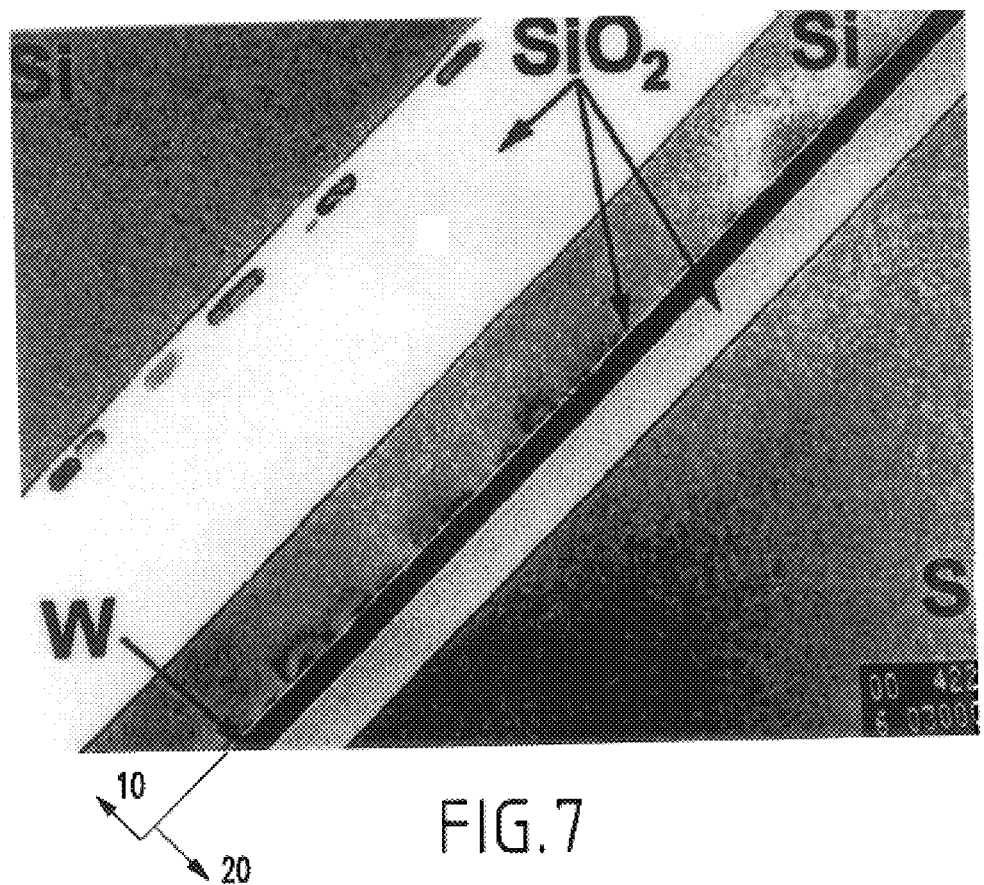
FIG. 7 is a transmission-electron micrograph showing first and second attached wafers, with the first wafer being a silicon-on-insulator (SOI) substrate with an oxide and the second wafer being a refractory metal (e.g., tungsten)-coated substrate.

FIG. 7 illustrates a state of the inventive structure after step 2 of the method described above. Specifically, FIG. 7 is a transmission-electron micrograph showing the first and second attached wafers 10, 20, with the first wafer 10 being the silicon-on-insulator (SOI) substrate with an oxide and the second wafer 20 being the refractory metal (e.g., tungsten)-coated substrate.

Figure 8:
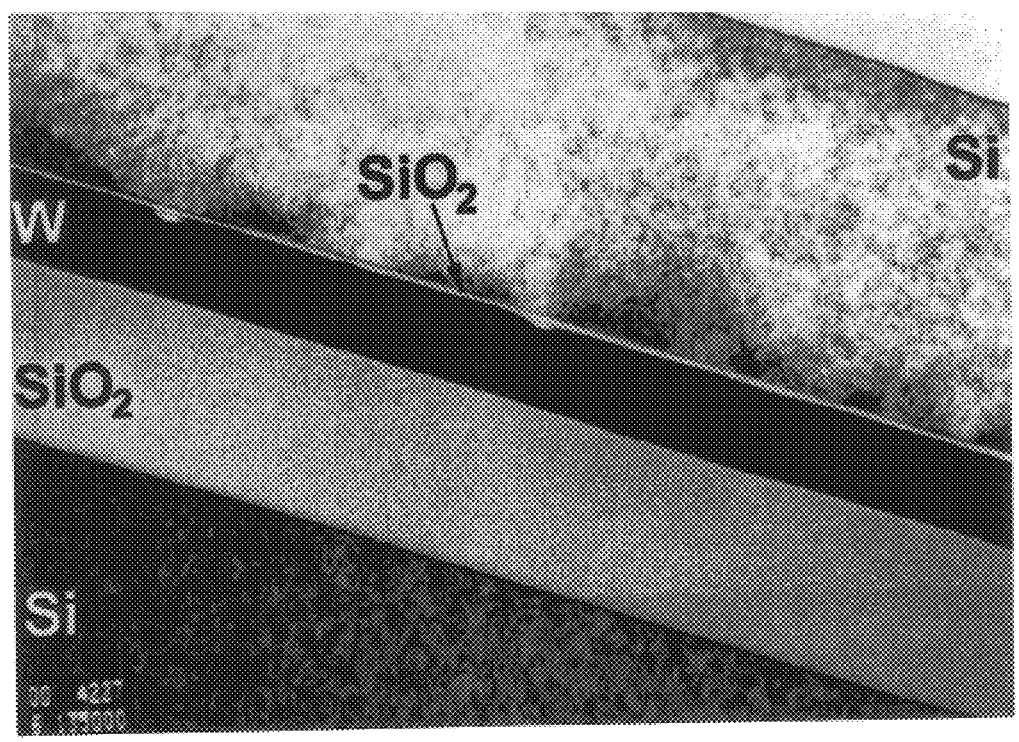
FIG. 8 is a transmission-electron micrograph showing the cross-section of the inventive structure following removal of the sacrificial wafer and oxide at the conclusion of the inventive method.

FIG. 8 illustrates a state of the inventive structure at the completion of step 3 of the method described above.

Specifically, FIG. 8 is a transmission-electron micrograph showing the cross-section of the silicon-oxide-tungsten-oxide-silicon substrate of the inventive structure following removal of the sacrificial wafer 10 and oxide.

Figure 9:
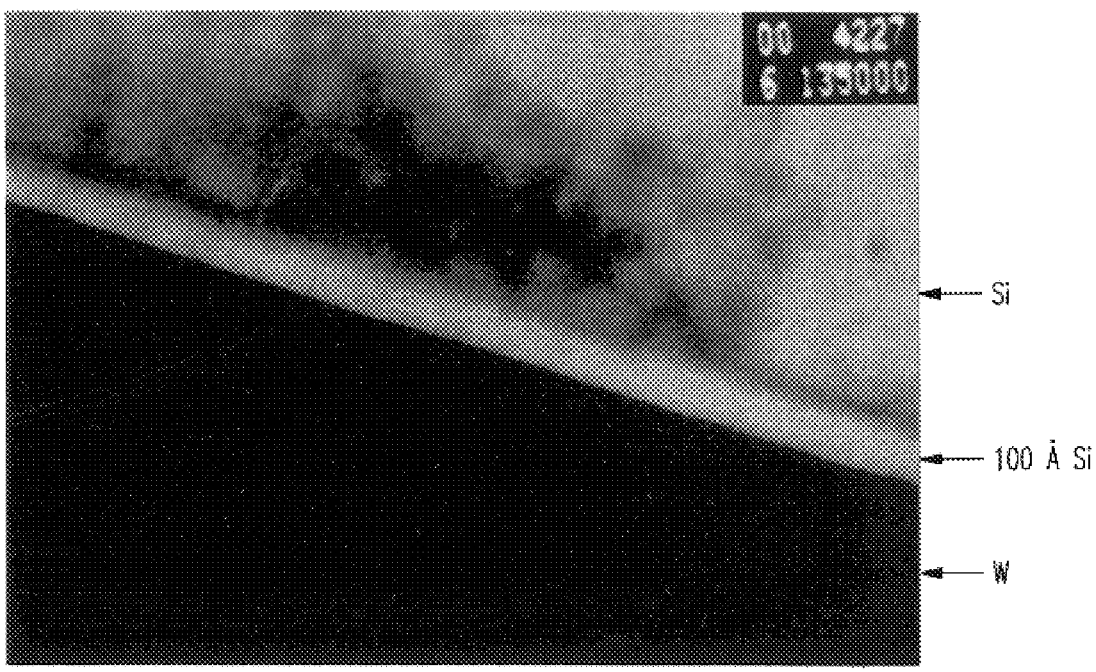
FIG. 9 is another transmission-electron micrograph showing the cross-section of the inventive structure following removal of the sacrificial wafer and oxide at the conclusion of the inventive method.

FIG. 9 illustrates a state of the inventive structure at the completion of step 4 of the method described above. Specifically, FIG. 9 is a transmission-electron micrograph showing the cross-section of the silicon-oxide-tungsten interface at the conclusion of the inventive method at a higher resolution showing the 10 nm gate oxide acuity.

Second Embodiment

Figure 10:
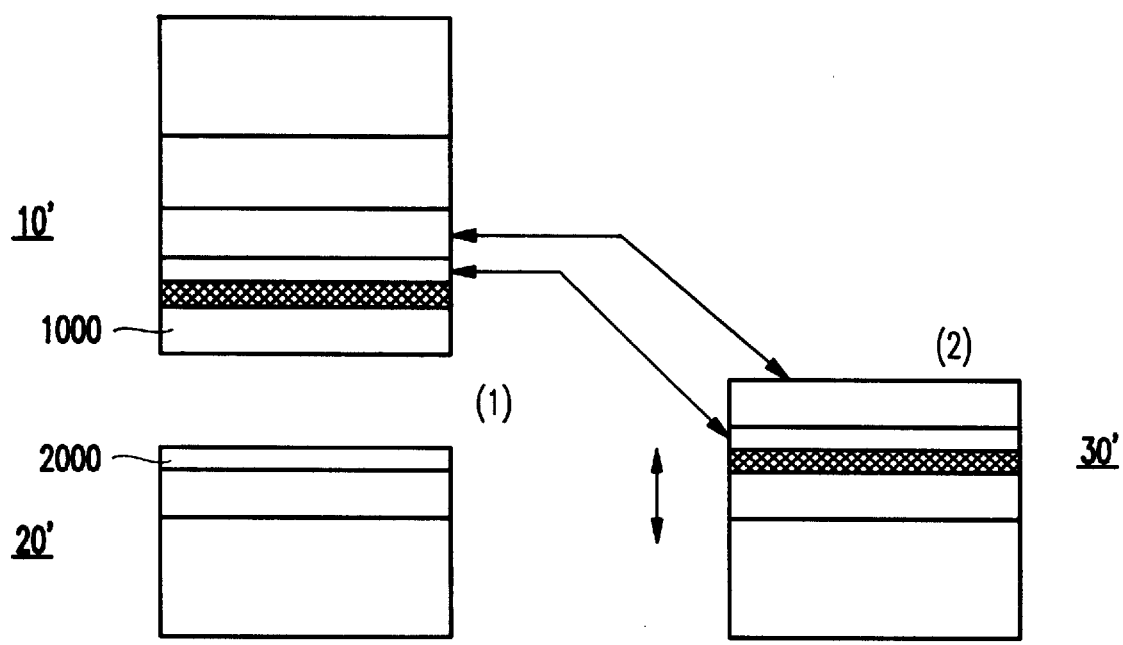
FIG. 10 illustrates alternative cross-sections of the back-plane structure having been etched and an oxide-oxide bond thereof.

There are other possible variations of the above-described first embodiment, as shown in FIG. 10.

FIG. 10 shows a structure where the bonded interface is in the buried oxide, and specifically shows an oxide-oxide bonding. The difference between the embodiment of FIG. 1 and that of FIG. 10 rests in the wafer 10' including the refractory metal back-plane and buried oxide 1000 being bonded to buried oxide 2000 on the sacrificial wafer, thereby to yield wafer 30' at the conclusion of the process. In this technique, the bonded interface has been completely removed from the active region of the device and is buried in the underlying substrate.

Such a structure is produced by a heat-cycle and cleaning operation, similar to that of the first embodiment, discussed above. This structure has a very smooth (e.g., sub-0.5 nm roughness) surface for bonding which can be achieved by touch polishing.

The second embodiment is advantageous over the first embodiment since for example the active device may be the backplane and above the back-plane may be placed the bonding device which would make it insensitive due to the bonding of oxide-oxide at the interface. However, a disadvantage would be a thicker buried oxide.

While the present invention has been described in terms of several preferred embodiments, those skilled in the art will recognize that the invention can be practiced with modification within the spirit and scope of the appended claims.

Having thus described our invention, what we claim as new and desire to secure by Letters Patent is as follows:

1. A back-plane for a semiconductor device, including:
   a back-gate comprising a refractory metal film formed on an oxidized substrate;
   a back-gate oxide formed on said back-gate so as to form an interface between said refractory metal film and said back-gate oxide that is substantially devoid of metal oxide; and
   a silicon layer formed on said back-gate oxide;
   wherein said refractory metal film is in atomically intimate contact with said back-gate oxide and bonded by a permanent and substantially heat-resistant bond to said back-gate oxide, and
   wherein said refractory metal film and said back-gate oxide provide an electrostatic potential barrier from a channel of said device towards said oxidized substrate.

2. The back-plane according to claim 1, wherein said substrate comprises a silicon-on-insulator (SOI) substrate and wherein said silicon layer comprises a single crystal silicon layer.

3. The back-plane according to claim 2, wherein said refractory metal comprises at least one of tungsten, tungsten nitride, titanium nitride, and alloys thereof.

4. The back-plane according to claim 3, wherein said substrate has a surface roughness maintained substantially to less than about 0.5 nm in rms roughness, and wherein said refactory metal film has a surface roughness of substantially less than about 0.5 nm roughness.

5. The back-plane according to claim 1, wherein said back-gate is hydrogen-treated.

6. The back-plane according to claim 1, wherein said back-gate oxide is hydrogen-treated.

7. The back-plane according to claim 1, wherein said back-gate is bonded to said back gate oxide by a heat treatment to provide a bonding interface therebetween.

8. The back-plane according to claim 1, wherein said back-gate has a length of approximately 25 nm.

9. The back-plane according to claim 1, wherein said back-gate is in atomically intimate contact with said back-gate oxide through a heating cycle in a nitrogen ambient.

10. The back-plane according to claim 1, wherein said back-gate oxide has a thickness substantially within a range of about 1 to about 20 nm.

11. The back-plane according to claim 1, wherein said back-gate has a thickness substantially within a range of about 3 to about 300 nm.

12. A back-plane for a semiconductor device, including:
   a back-gate comprising a refractory metal film formed on an oxidized substrate;
   a back-gate oxide formed on said back-gate so as to form an interface between said refractory metal film and said back-gate oxide that is substantially devoid of metal oxide; and
   a silicon layer formed on said back-gate oxide,
   wherein said refractory metal film is in atomically intimate contact with said back-gate oxide and bonded by a permanent and substantially heat-resistant bond to said back-gate oxide.

13. The back-plane according to claim 12, wherein said refractory metal film and said back-gate oxide provide an electrostatic potential barrier from a channel of said device towards said oxidized substrate.

14. A back-plane for a semiconductor device, including:
   a back-gate comprising a refractory metal film formed on an oxidized substrate;
   a back-gate oxide formed on said back-gate so as to form an interface between said refractory metal film and said back-gate oxide that is substantially devoid of metal oxide;
   a permanent and substantially heat-resistant bond formed between said refractory metal film and said back-gate oxide, and
   a silicon layer formed on said back-gate oxide.

15. The back plane according to claim 12, wherein said refractory metal film and said back-gate oxide provide an electrostatic potential barrier from a channel of said device towards said oxidized substrate.

* * * * *